United States Patent
Kittl et al.

(10) Patent No.: US 10,614,868 B2
(45) Date of Patent: Apr. 7, 2020

(54) MEMORY DEVICE WITH STRONG POLARIZATION COUPLING

(71) Applicant: Samsung Electronics Co., LTD., Gyeonggi-do (KR)

(72) Inventors: Jorge A. Kittl, Austin, TX (US); Borna J. Obradovic, Leander, TX (US); Ryan M. Hatcher, Austin, TX (US); Titash Rakshit, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/142,944

(22) Filed: Sep. 26, 2018

(65) Prior Publication Data

US 2019/0318774 A1    Oct. 17, 2019

Related U.S. Application Data

(60) Provisional application No. 62/658,543, filed on Apr. 16, 2018.

(51) Int. Cl.
*G11C 11/22* (2006.01)

(52) U.S. Cl.
CPC ........ *G11C 11/221* (2013.01); *G11C 11/2259* (2013.01)

(58) Field of Classification Search
CPC ................... G11C 11/221; G11C 11/2259
USPC ....................................................... 365/145
See application file for complete search history.

(56) References Cited

U.S. PATENT DOCUMENTS

| | | | |
|---|---|---|---|
| 5,661,319 A | 8/1997 | Fujii | |
| 5,889,299 A | 3/1999 | Abe | |
| 6,420,192 B2 | 7/2002 | Miki | |
| 6,489,645 B1 | 12/2002 | Uchiyama | |
| 7,030,435 B2 | 4/2006 | Gnadinger | |
| 7,700,985 B2 | 4/2010 | Xi | |
| 7,973,348 B1 | 7/2011 | Dalton | |
| 9,362,487 B2 | 6/2016 | Inumiya | |
| 9,536,975 B2 | 1/2017 | Kolpak | |
| 2002/0153542 A1 | 10/2002 | Gnadinger | |
| 2003/0136331 A1 | 7/2003 | Ami | |
| 2008/0048227 A1 | 2/2008 | Hwang | |
| 2009/0290404 A1* | 11/2009 | Kaneko | G11C 11/22 365/145 |
| 2011/0182102 A1 | 7/2011 | Minami | |
| 2012/0292677 A1 | 11/2012 | Dubourdieu | |
| 2015/0310905 A1 | 10/2015 | Karda | |
| 2018/0040711 A1 | 2/2018 | Rondinelli | |
| 2019/0122824 A1* | 4/2019 | Lien | H01G 4/33 |

* cited by examiner

*Primary Examiner* — Fernando Hidalgo
(74) *Attorney, Agent, or Firm* — Van Pelt, Yi & James LLP

(57) ABSTRACT

A semiconductor memory device and method for providing the semiconductor memory device are described. The semiconductor memory device includes a ferroelectric capacitor. The ferroelectric capacitor includes a first electrode, a second electrode and a multilayer insulator structure between the first and second electrodes. The multilayer insulator structure includes at least one ferroelectric layer and at least one dielectric layer. The at least one ferroelectric layer and the at least one dielectric layer share at least one interface and have a strong polarization coupling.

20 Claims, 4 Drawing Sheets

MEMORY DEVICE WITH STRONG POLARIZATION COUPLING

CROSS-REFERENCE TO RELATED APPLICATIONS

This application claims the benefit of provisional Patent Application Ser. No. 62/658,543, filed Apr. 16, 2018, entitled "DRAM CELL WITH STRONG POLARIZATION COUPLING", assigned to the assignee of the present application, and incorporated herein by reference.

BACKGROUND

Conventional dynamic random-access memory (DRAM) cells utilize capacitors to store data. It is desired to maintain the capacitance of such DRAM storage cell capacitors as the DRAM memories are shrunk to smaller dimensions in order to prevent increased leakage. In order to do so, high dielectric constant (high κ) materials may be used in the DRAM memory cell capacitor. This approach has not been able to maintain the capacitance of DRAM cells to lower sized nodes. Consequently, scaling of DRAM has been adversely affected.

Capacitors having a ferroelectric layer in the dielectric between the two electrodes are known. Most such conventional approaches focus on a capacitance matching condition between the ferroelectric layer and the remainder of the capacitor's dielectric. However, it is not clear from such approaches that the desired capacitance is realizable or that the capacitor will not suffer from degradation in performance for other reasons.

Accordingly, what is desired is an improved semiconductor memory device, such as a DRAM memory cell, that may be scalable to higher areal densities.

DETAILED DESCRIPTION OF THE INVENTION

The exemplary embodiments relate to semiconductor memory devices having a capacitor including at least one ferroelectric layer and at least one dielectric layer having a strong polarization coupling. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 1:
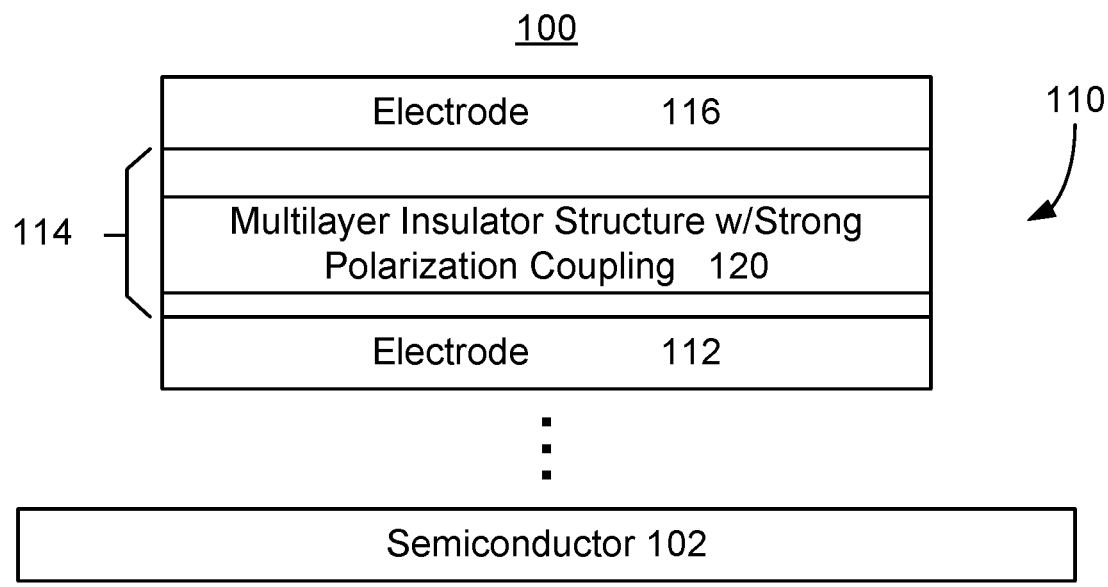
FIG. 1 is a diagram depicting an exemplary embodiment of a semiconductor memory device including a capacitor utilizing a multilayer insulator structure having a strong polarization coupling.
Figure 2:
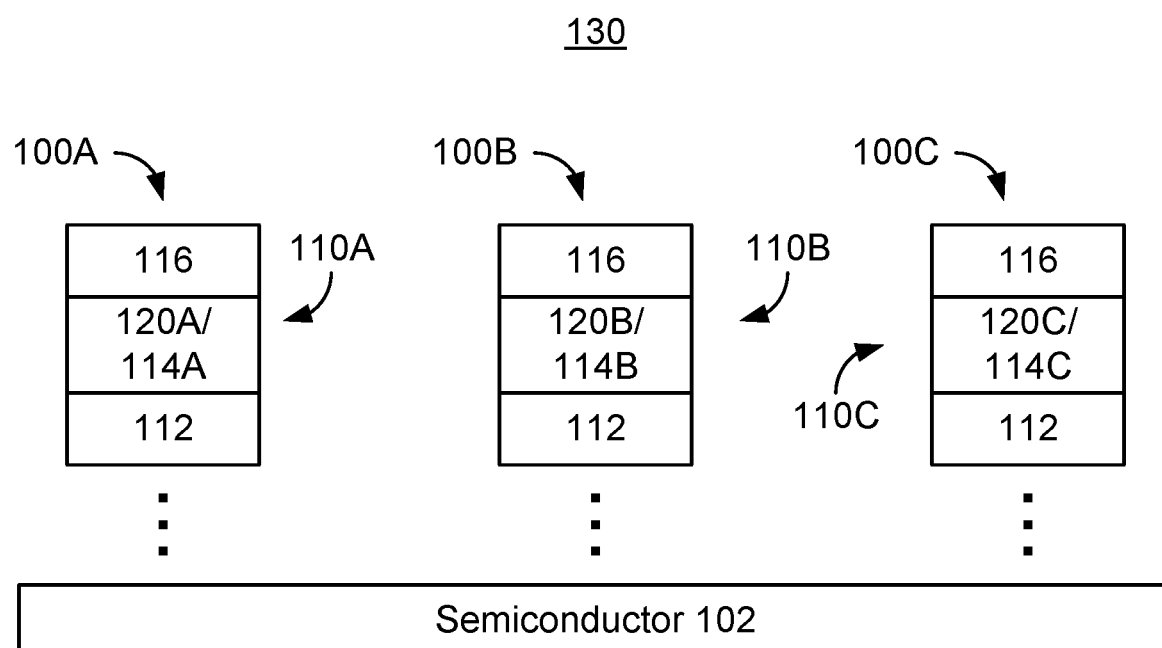
FIG. 2 is a diagram depicting an exemplary embodiment of a semiconductor memory device having multiple memory cells using a ferroelectric capacitor including a multilayer insulator structure having a strong polarization coupling.
Figure 3:
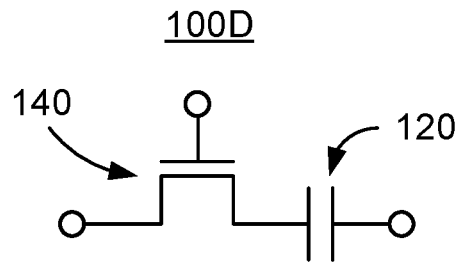
FIG. 3 is a schematic of another exemplary embodiment of a semiconductor memory cell including a ferroelectric capacitor utilizing a multilayer insulator structure having a strong polarization coupling.

A semiconductor memory device and method for providing the semiconductor memory device are described. The semiconductor memory device includes a ferroelectric capacitor. The ferroelectric capacitor includes a first electrode, a second electrode and a multilayer insulator structure between the first and second electrodes. The multilayer insulator structure includes at least one ferroelectric layer and at least one dielectric layer. The at least one ferroelectric layer and the at least one dielectric layer share at least one interface and have a strong polarization coupling FIGS. 1 and 2 are diagrams depicting an exemplary embodiment of a semiconductor memory cell 100 including a multilayer insulator structure having a strong polarization coupling and multiple such semiconductor memory cells 100A, 100B and 100C integrated into an array 130. For simplicity, only a portion of the semiconductor devices 100 and 130 are shown and FIGS. 1-2 are not to scale. FIG. 3 is a schematic depicting another exemplary embodiment of such a memory cell 100D.

Referring to FIG. 1, the semiconductor memory device 100 is formed on a semiconductor substrate 102 and includes at least a ferroelectric capacitor 110. As can be seen in FIG. 3, in some embodiments, a selection transistor 120 may also be part of the memory cell 100D. Such a selection transistor 120 is not shown in FIGS. 1-2. The semiconductor memory device 100 may be a single memory cell, for example for a DRAM memory. The ferroelectric capacitor 110 for the semiconductor memory device 100 includes electrodes 112 and 116 separated by a dielectric structure 114. The dielectric structure 114 includes a multilayer insulator structure 120 having a strong polarization coupling. In some embodiments, the dielectric structure 1014 is formed only of the multilayer insulator structure 120. In other embodiments, additional layers may be included.

The multilayer insulator structure 120 includes at least one ferroelectric layer and at least one dielectric layer. For example, the multilayer insulator structure 110 may be a bilayer consisting of a single dielectric layer and a single ferroelectric layer. In other embodiments, the multilayer insulator structure 110 may include three or more layers. In such embodiments, the ferroelectric layer(s) and dielectric layer(s) are interleaved. The ferroelectric layer(s) and dielectric layer(s) share interface(s). In some embodiments, dielectric layers are closest to the electrodes. In other embodiments, ferroelectric layers are closest to the electrodes. In still other embodiments, a dielectric layer may be closest to one electrode while a ferroelectric layer is closest to the other electrode. The ferroelectric and dielectric layer(s) may be epitaxially grown on each other.

The ferroelectric layer(s) and dielectric layer(s) have a strong polarization coupling. As used herein, polarization refers to the component of the electrical polarization near the interface and perpendicular to the interface. A strong polarization coupling between the ferroelectric and dielectric layers is such that the component of the electrical polarization of the ferroelectric layer perpendicular to and near the interface is strongly coupled to the electrical polarization of the dielectric layer perpendicular to and near the interface. In some embodiments, this accomplished by forming the ferroelectric layer epitaxially on the dielectric layer. In some embodiments, a strong polarization coupling between the ferroelectric layer(s) and the dielectric layer(s) is such that the electrical polarization(s) of the ferroelectric layer(s) and the electrical polarization(s) of the dielectric layer(s) are within twenty percent of each other. Again, these electrical polarizations are the components that are perpendicular to and close to the interface. In some such embodiments, the polarizations of the layers are within ten percent of each other. In other embodiments, the polarizations of the layers are within two percent of each other. Because of the strong polarization coupling, one or more of the ferroelectric layers in the structure 110 may acts as a dielectric at small polarizations. Consequently, the ferroelectric-dielectric combination may behave as a high-k dielectric with higher-k than the dielectric layer alone.

FIG. 2 depicts semiconductor memory devices 100A, 100B and 100C (collectively semiconductor devices 100) integrated into a device 130. Although only three semiconductor devices 100 are shown, typically a different (e.g. larger) number of devices are incorporated into a single semiconductor device 130. Each of the semiconductor devices 100 may include other components such as a selection transistor that are not shown for clarity. Because each may be different, each semiconductor device 100A, 100B and 100C is labeled differently. Each semiconductor device is analogous to the semiconductor device 100 and includes components that are analogous to those described with respect to FIG. 1. Each semiconductor device 100A, 100B and 100C thus includes a ferroelectric capacitor 110A, 110B and 110C that are analogous to the ferroelectric capacitor 110. Each ferroelectric capacitor 110A, 110B and 110C include electrodes 112 and 116 separated by a dielectric structure 114A, 114B and 114C, respectively, that is analogous to the dielectric structure 114 of FIG. 1. The dielectric structures 114A, 114B and 114C include or consist of multilayer insulator structures 120A, 120B and 120C, respectively, that are analogous to multilayer gate insulator structure 120. The multilayer insulator structures 120A, 120B and 120C thus include ferroelectric layer(s) and dielectric layer(s) that share interface(s) and have polarizations that are strongly coupled. In some embodiments, the semiconductor memory cells 100A, 100B and 100C are the same. Thus, the multilayer insulator structures 120A, 120B and 120C may be formed of the same materials, have the same number of layers and be substantially the same. In other embodiments, however, the multilayer gate insulator structures 120A, 120B and 120C may be different.

The multilayer insulator structures 120, 120A, 120B and/or 120C have a strong polarization coupling between at least some of the dielectric layer(s) and ferroelectric layer(s). This allows such dielectric and ferroelectric layers to function as a very high κ dielectric, avoiding hysteresis in the ferroelectric layer. Use of the multilayer insulator structures 120, 120A, 120B and/or 120C may allow very high κ values with little low leakage for the ferroelectric capacitors 110, 110A, 110B and/or 110C, respectively, in the memory cells 100, 100A, 100B and/or 100C. Thus, very low equivalent oxide thickness (EOT) and scaling to smaller nodes may be improved.

Figure 4:
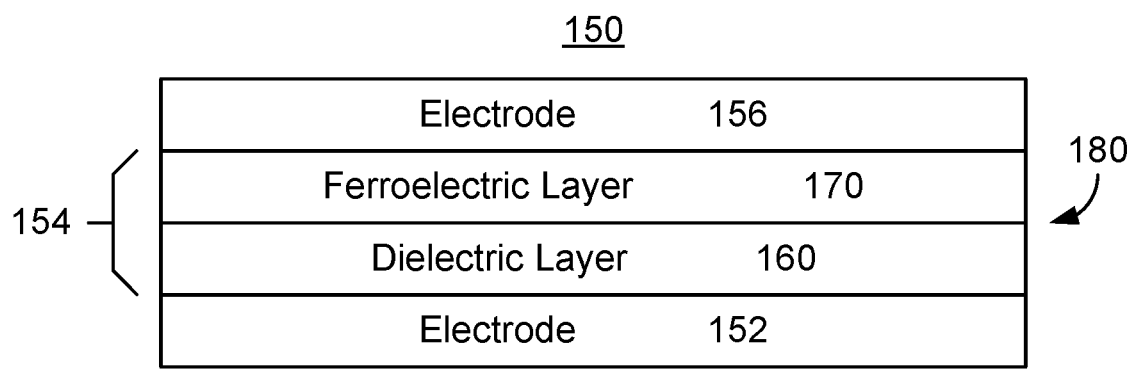
FIG. 4 is a diagram depicting an exemplary embodiment of a ferroelectric capacitor including a multilayer insulator structure having a strong polarization coupling and usable in a semiconductor memory device.

FIG. 4 is a diagram depicting an exemplary embodiment of a ferroelectric capacitor 150 having a dielectric structure with a strong polarization coupling. The ferroelectric capacitor 150 includes electrodes 156 separated by a dielectric structure that consists of a multilayer insulator structure 154. The multilayer insulator structure 154 includes a dielectric layer 160 and an adjoining ferroelectric layer 170 that share an interface 180. In some embodiments, the dielectric layer 160 may be a perovskite oxide such as $SrTiO_3$, $Al_2O_3$, $SiO_2$ and SiON may be deposited in step 212. In some embodiments, the ferroelectric layer may include one or more of ferroelectric perovskite(s) (such as $Pb(Zr—Ti)O_3$ (PZT) and/or $BaTiO_3$) and $HfO_2$-based ferroelectric material(s) (such as Si-doped $HfO_2$ or ferroelectric $(Hf—Zr)O_2$). The electrodes 152 and 156 may include material(s) such as strontium ruthenate oxide (SRO) (particularly for SrTiO3 and/or PZT) and/or TiN (particularly for materials such as doped HfO₂ or (Hf—Zr)O₂).

The layers 160 and 170 have a strong polarization coupling. A strong polarization coupling between the layers 160 and 170 is such that the component of the electrical polarization of the ferroelectric layer 170 perpendicular to and near the interface 180 is strongly coupled to the electrical polarization of the dielectric layer 160 perpendicular to and near the interface 180. This coupling is believed to originate at the interface 180 and thus is of interest close to the interface 180. In some embodiments, close to (or near) the interface 180 may mean not more than five nanometers from the interface 180. In some such embodiments, close to the interface 180 is not more than two nanometers from the interface. In some embodiments, near the interface 180 is not more than one nanometer from the interface 180.

In some embodiments, the strong polarization coupling means that the electrical polarization of the ferroelectric layer 170 and the electrical polarization of the dielectric layer 160 are within twenty percent. This criterion for strong polarization may be expressed as: $|P_{FE}-P_{DE}|<0.1|P_{FEMAX}+P_{DEMAX}|$ or $|P_{FE}-P_{DE}|<0.1|P_{FE}+P_{DE}|$. $P_{FE}$ is the component of the polarization of the ferroelectric layer 170 normal to the interface 180 and close to the interface 180. $P_{DE}$ is the polarization of the dielectric layer 160 normal and close to the interface 180. $P_{FEMAX}$ is the absolute value of the maximum component of the polarization of the ferroelectric layer 170 perpendicular and close to the interface 180 during operation. $P_{DEMAX}$ is the absolute value of the maximum component of the polarization of the dielectric layer 160 perpendicular and close to the interface 180 during operation. In some embodiments, the polarizations of the layers 160 and 170 are within ten percent. This may correspond to $|P_{FE}-P_{DE}|<0.05|P_{FEMAX}+P_{DEMAX}|$ or $|P_{FE}-P_{DE}|<0.05|P_{FE}+P_{DE}|$. Similarly, the polarizations of the layers 160 and 170 may be within two percent of each other. This condition may be $|P_{FE}-P_{DE}|<0.01|P_{FEMAX}+P_{DEMAX}|$ or $|P_{FE}-P_{DE}|<0.01|P_{FE}+P_{DE}|$. In other embodiments, the polarizations of the layers 160 and 170 may be within one percent of each other. This condition may be expressed as $|P_{FE}-P_{DE}|<0.005|P_{FEMAX}+P_{DEMAX}|$ or $|P_{FE}-P_{DE}|<0.005|P_{FE}+P_{DE}|$.

Alternatively, the strong polarization coupling between the ferroelectric layer 170 and the dielectric layer 160 may be given in terms of the interface polarization coupling constant, $\lambda$, the thickness of the dielectric layer 160 ($t_{DE}$), the thickness of the ferroelectric layer 170 ($t_{FE}$), and other material parameters. In some embodiments, the combination of the layers 160 and 170 is at least one nanometer thick and not more than thirty nanometers thick. For perovskite systems the combined thickness of the layers 160 and 170 may be at least five and not more than forty nanometers for a SiO₂/ferroelectric Hf-based oxide. In such an embodiment, the SiO₂ dielectric layer 160 might be at least 1.5 nm and not more than 3 nm. For a ferroelectric layer 170 that is a Hf-based oxide, the thickness may be at least 1.5 nm and not more than 6 nm. A ferroelectric Hf-based oxide used in the ferroelectric layer 170 may be a ferroelectric doped-HfO₂ (e.g. doped with Si, Al, Y ...) or a ferroelectric (Hf—Zr)O₂ (also called HZO), typically Hf₀.₅Zr₀.₅O₂. For example, a strong polarization coupling between the layers 160 and 170 may be such that $\lambda > -\alpha_{FE}*t_{FE}$. Alternatively, the condition of strong polarization coupling may be given by $\lambda > |\alpha_{FE}|*t_{FE}$, where $\alpha_{FE}$ is a material parameter of the ferroelectric layer, which is defined through an approximation to the energy of the ferroelectric given by the Landau expression:

$$U_b^{ferroelectric} = A\left[d_{FE}\left(\frac{\alpha_{FE}}{2}P_{FE}^2 + \frac{\beta_{FE}}{4}P_{FE}^4 + \frac{\gamma_{FE}}{6}P_{FE}^6\right)\right]$$

Where $\alpha_{FE}<0$ and either $\beta_{FE}$ or $\gamma_{FE}$ are $>0$: for materials with second order ferroelectric phase transitions, $\beta_{FE}>0$, while materials with first order ferroelectric phase transition may be modelled with $\beta_{FE}<0$ and $\gamma_{FE}>0$.

In some embodiments, the strong polarization coupling is such that the overall system energy for the multilayer gate insulator structure 150 results in the lowest free energy of the combined dielectric and ferroelectric layers 160 and 170 under operation conditions corresponding to a polarization behavior of a dielectric. Stated differently, the electrical polarization of the multilayer gate insulator structure 150 is proportional to the applied electric field with no hysteretic behavior in such cases.

This strong polarization coupling is in contrast the use of ferroelectric layers in most conventional ferroelectric capacitor. In such conventional ferroelectric capacitors, there is typically little or no polarization coupling between the layers. At incoherent and/or disordered interfaces, there is no incentive to maintain a matching of the polarizations of the dielectric and ferroelectric layers. Each layer minimizes its free energy independently by adopting its optimal polarization. In contrast, the strong polarization condition for the multilayer insulator structure 154, may be explained as follows. A polarization coupling may exist in epitaxial systems, such as between epitaxial perovskite layers in which one layer is a ferroelectric. In some embodiments, the layers 160 and 170 may fulfill these criteria. The interfacial free energy, $f_i$, of the interface between two layers 160 and 170 may be expressed as:

$$U_i = (\lambda/2)(P_{10}-P_{20})^2$$

$P_{10}$ and $P_{20}$ are the interfacial polarizations (polarizations components normal to the interface 180, taken close to the interface as described above) of layers 160 and 170 respectively. As discussed above, the parameter $\lambda$ is the coupling constant describing the strength of the polarization coupling (interaction).

In epitaxial systems in which one or both layers are ferroelectric (and may be piezoelectric), strong interfacial coupling may be present. In these systems, there is a large interface energy penalty to a difference between polarizations at and/or near the interface. When the multilayer insulator structure 154 contains thin layers, the interface free energy term may dominate over the volume free energy terms of the layers 160 and 170. Consequently, the multilayer insulator structure 150 may adopt a relatively uniform polarization across dissimilar layers. Stated differently, the polarizations may be strongly coupled as described above even though one layer 170 is a ferroelectric and the other layer 160 is not.

To further explain the strong coupling, a simplified analysis for direct contact between a ferroelectric layer 170 and a dielectric layer 160 is described. The multilayer 150 may be used in a MOS device with an area, A, of the gate 120, and thicknesses of the dielectric and ferroelectric layers 160 and 170 of $d_{DE}$ and $d_{FE}$ respectively. The total system energy may be modeled as:

$$U_b^{system} = A \Big[ d_{DE}\Big(\frac{\alpha_{DE}}{2} P_{DE}^2\Big) +$$
$$d_{FE}\Big(\frac{\alpha_{FE}}{2} P_{FE}^2 + \frac{\beta_{FE}}{4} P_{FE}^4 + \frac{\gamma_{FE}}{6} P_{FE}^6 \Big) + \frac{\lambda}{2}(P_{DE} - P_{FE})^2 \Big]$$

where $\lambda(>0)$ is the interface polarization coupling constant describing the strength of the interface polarization coupling, $P_{DE}$ is the polarization of the dielectric layer 160, $\alpha_{DE}>0$ is a material parameter of the dielectric layer 160, $P_{FE}$ is the polarization of the ferroelectric layer 170, $\alpha_{FE}/\beta_{FE}$ and $\gamma_{FE}$ are material parameters for the ferroelectric layer 170. In such a case, $\alpha_{FE}<0$ (for a temperature in which the material used in the layer 170 is in the ferroelectric phase). For materials with second order ferroelectric phase transitions, $\beta_{FE}>0$, while materials with first order ferroelectric phase transition may be modelled with $\beta_{FE}<0$ and $\gamma_{FE}>0$.

At small polarizations:

$$U_b^{system} \approx A \Big[ d_{DE}\Big(\frac{\alpha_{DE}}{2} P_{DE}^2\Big) + d_{FE}\Big(\frac{\alpha_{FE}}{2} P_{FE}^2\Big) + \frac{\lambda}{2}(P_{DE} - P_{FE})^2 \Big]$$

Thus, the condition of strong polarization coupling between the dielectric layer 160 and the ferroelectric layer 170 can be expressed as:

$$\lambda > -\alpha_{FE} d_{FE} = |\alpha_{FE}| d_{FE}$$

In some embodiments, $$\lambda >> -\alpha_{FE} d_{FE} = |\alpha_{FE}| d_{FE}$$

In some embodiments, >> indicates at least a factor of 5 larger. In other embodiments, >> indicates at least one order of magnitude larger. In some embodiments, >> indicates at least two orders of magnitude larger. In some such embodiments, >> is at least three orders of magnitude larger.

In some embodiments, the following condition is also met:

$$d_{DE}\alpha_{DE} > |\alpha_{FE}| d_{FE} \frac{\lambda}{(\lambda - |\alpha_{FE}| d_{FE})}$$

In such cases, the ferroelectric layer 170 in the multilayer gate insulator structure 150 behaves like a dielectric. In other words, the ferroelectric layer 170 has an electrical polarization that is proportional to the applied electric field with no hysteretic behavior.

Thus, the strong polarization coupling between the layers 160 and 170 may be expressed in a number of ways. This strong polarization coupling may also result in the multilayer insulator structure 154 having an electrical polarization that is proportional to the applied field and which does not exhibit hysteresis despite the presence of the ferroelectric layer 170. Moreover, such a multilayer insulator structure 154 may have a very high κ in combination with low leakage. Thus, EOT scaling in semiconductor devices such as DRAM storage capacitors using the multilayer insulator structure 154 may be improved.

Figure 5:
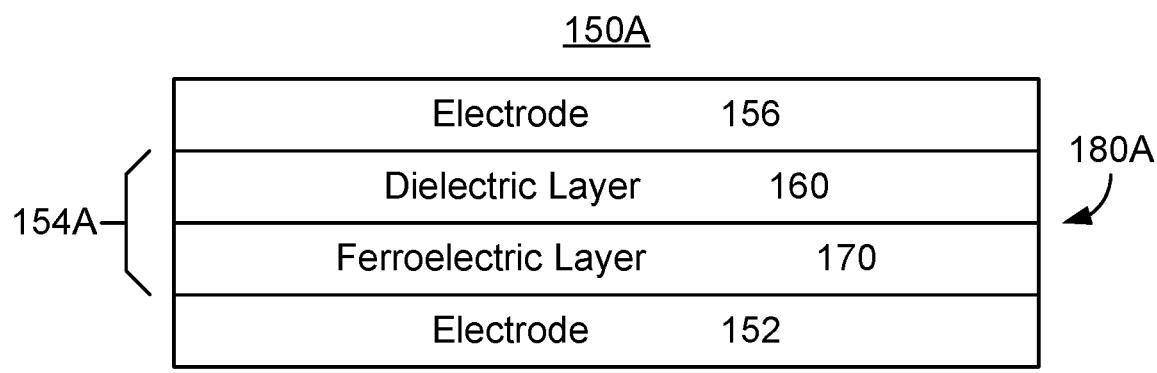
FIG. 5 is a diagram depicting another exemplary embodiment of a ferroelectric capacitor including a multilayer insulator structure having a strong polarization coupling and usable in a semiconductor memory device.

FIG. 5 depicts another exemplary embodiment of a ferroelectric capacitor 150A including electrodes 152 and 156 sandwiching multilayer gate insulating structure 154. The ferroelectric capacitor 150A is analogous to the ferroelectric capacitor 150. Consequently, analogous components have similar layers. The electrodes 152 and 156 may include the material(s) described above. Similarly, the multilayer insulator structure 154A includes layers 160 and 170 having interface 180A. The layers 160 and 170 are strongly coupled as described above. The ferroelectric layer 170 may be provided closer to the bottom electrode 152 and thus may be formed prior to the dielectric layer 160. However, the discussion above with respect to the polarization coupling between the layers 160 and 170 and the interface 180 also applies to the polarization coupling between the layers 160 and 170 and the interface 180A. Thus, the multilayer insulator structure 154A still includes a dielectric layer 160 and a ferroelectric layer 170 having polarizations that are strongly coupled. Consequently, the benefits described above might be achieved for the ferroelectric capacitor 150A.

Figure 6:
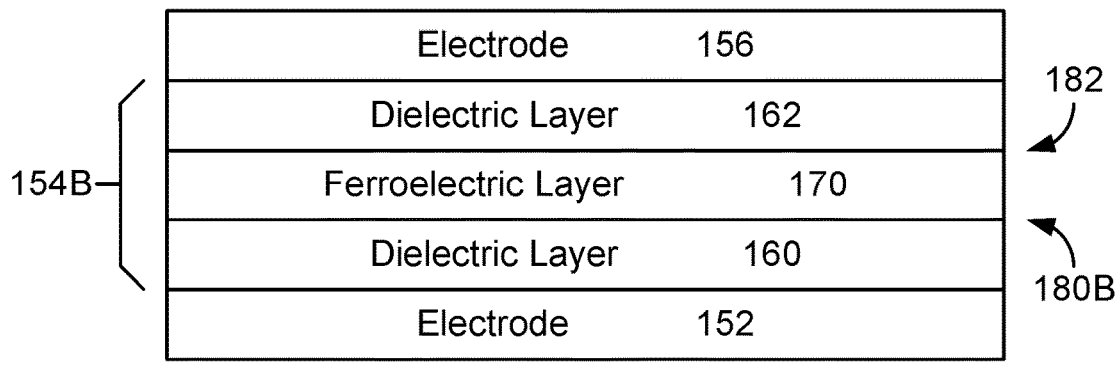
FIG. 6 is a diagram depicting another exemplary embodiment of a ferroelectric capacitor including a multilayer insulator structure having a strong polarization coupling and usable in a semiconductor memory device.

The above can be generalized to more complex stacks than bilayers, and to include any interactions with the electrodes. FIG. 6 is a diagram depicting an exemplary embodiment of a ferroelectric capacitor 150B having a strong polarization coupling. The ferroelectric capacitor 150B includes a multilayer insulator structure 154B between electrodes 152 and 156. The multilayer insulator structure 154B is analogous to the multilayer insulator structure(s) 154/154A. Thus, the multilayer insulator structure 154B includes a dielectric layer 160 and an adjoining ferroelectric layer that share an interface 180B and which are analogous to the layers 160 and 170 depicted in FIGS. 3-4. In addition, the multilayer insulator structure 154B includes an additional dielectric layer 162 that also shares an interface 182 with the ferroelectric layer 170. The ferroelectric layer 170 is thus sandwiched between the dielectric layers 160 and 162. The dielectric layers 160 and 162 may be made of the same or different materials.

The layers 160, 170 and 162 have a strong polarization coupling. A strong polarization coupling between the layers 160, 162 and 170 is such that the component of the electrical polarization of the ferroelectric layer 170 perpendicular to and near the interface between the layers 160 and 170 is strongly coupled to the electrical polarization of the dielectric layer 160 perpendicular to and near the interface between the layers 160 and 170. Similarly, the polarization coupling between the layers 162 and 170 is such that the component of the electrical polarization of the ferroelectric layer 170 perpendicular to and near the interface between the layers 162 and 170 is strongly coupled to the electrical polarization of the dielectric layer 162 perpendicular to and near the interface between the layers 162 and 170. Thus, the electrical polarizations of the layers 160, 162 and 170 are within twenty percent. In some embodiments, the polarizations of the layers 160, 162 and 170 are within ten percent. Similarly, the polarizations of the layers 160, 162 and 170 may be within two percent of each other. The polarizations of the layers 160, 162 and 170 may be within one percent of each other in some embodiments. These conditions may be expressed as above. However, in some embodiments, all of the layers 160, 162 and 170 have polarizations that are strongly coupled. In other embodiments, only the layers 160 and 170 or only the layers 170 and 162 have polarizations that are strongly coupled.

Alternatively, the strong polarization coupling between the ferroelectric layer 170 and the dielectric layers 160 and 162 may be expressed in terms of the interface polarization coupling constants for each of the interfaces, λ1 and λ2, the thickness of the ferroelectric layer 170 ($t_{FE}$), and other material parameters. For example, a strong polarization coupling between the layers 160, 162 and 170 may be expressed as $\lambda 1 + \lambda 2 > -\alpha_{FE} * t_{FE}$. Alternatively, this may be viewed as: $\lambda 1 + \lambda 2 > |\alpha_{FE}| * t_{FE}$. This may also be expressed as the sum of the thicknesses of the layers. The strong polarization coupling may also be expressed as:

$$\alpha_{DE} d_{DE} > |\alpha_{FE}| d_{FE} \lambda/(\lambda - |\alpha_{FE}| d_{FE})$$

where $d_{FE}$ is the total thickness of the ferroelectric layer(s), $d_{DE}$ is the total thickness of the dielectric layers and $\lambda$ an interface polarization coupling constant. The total thickness of the ferroelectric layers is a first sum of the thickness for each ferroelectric layer 170 (in this case the thickness of the single layer). The total thickness of the dielectric layers is a sum of thicknesses for each of the dielectric layers 160 and 162 ($t_{160}+t_{162}$). In some embodiments, the strong polarization coupling is such that the polarization of the ferroelectric layer 170 corresponds to that of a dielectric. Stated differently, the electrical polarization of the ferroelectric layer 170 is proportional to the applied electric field with no hysteretic behavior. Such a multilayer insulator structure 154B may have a very high κ in combination with low leakage. Thus, EOT scaling in semiconductor memory devices, such as DRAM cells, using the multilayer insulator structure 154B may be improved.

Figure 7:
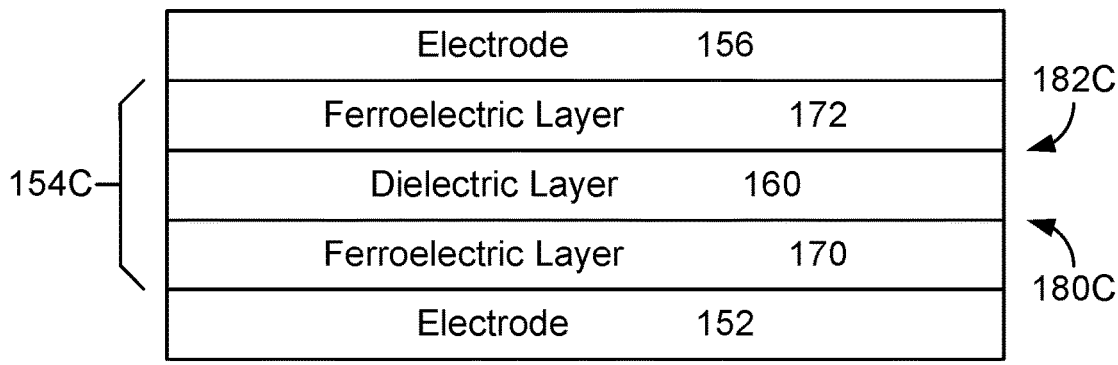
FIG. 7 is a diagram depicting another exemplary embodiment of a ferroelectric capacitor including a multilayer insulator structure having a strong polarization coupling and usable in a semiconductor memory device.

FIG. 7 depicts another exemplary embodiment of a ferroelectric capacitor 150C including electrodes 152 and 156 sandwiching multilayer gate insulating structure 154C. The ferroelectric capacitor 150C is analogous to the ferroelectric capacitor(s) 150, 150A and 150B. Consequently, analogous components have similar layers. The electrodes 152 and 156 may include the material(s) described above. Similarly, the multilayer insulator structure 154C includes layers 160 and 170 having interface 180C. The layers 160 and 170 are strongly coupled as described above. The ferroelectric layer 170 may be provided closer to the bottom electrode 152 and thus may be formed prior to the dielectric layer 160. The discussion above with respect to the polarization coupling between the layers 160 and 170 and the interface 180 also applies to the polarization coupling between the layers 160 and 170 and the interface 180C.

The multilayer insulator structure 154C also includes ferroelectric layer 172 that shares interface 182C with the dielectric layer 160. The polarizations of the ferroelectric layer 172 and the dielectric layer 160 may also be strongly coupled. The discussion above with respect to the multilayer insulator structures 154, 154A and 154B applies to the multilayer insulator structure 154C. Thus, some or all of the layers 160, 170 and 172 have polarizations that are strongly coupled. In some embodiments, all of the layers 160, 170 and 172 have polarizations that are strongly coupled. In other embodiments, only the layers 160 and 170 or only the layers 160 and 172 have polarizations that are strongly coupled. Thus, the multilayer insulator structure 154C still includes a dielectric layer 160 and ferroelectric layers 170 and 172 having polarizations that are strongly coupled. Consequently, the benefits described above might be achieved for the ferroelectric capacitor 150C.

Figure 8:
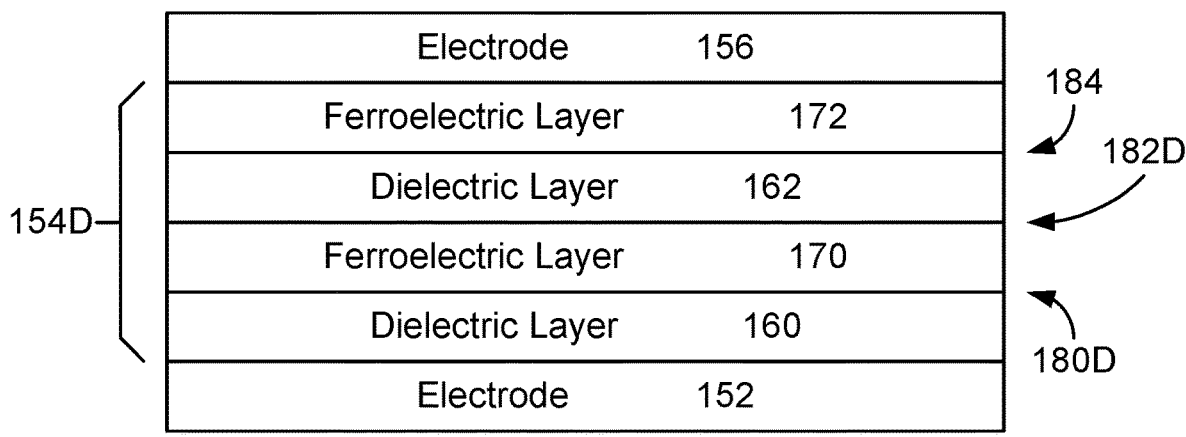
FIG. 8 is a diagram depicting another exemplary embodiment of a ferroelectric capacitor including a multilayer insulator structure having a strong polarization coupling and usable in a semiconductor memory device.

This can be further generalized to another number of dielectric and ferroelectric layers that are interleaved. For example, FIG. 8 is a diagram depicting an exemplary embodiment of a ferroelectric capacitor 150D including electrodes 152 and 156 sandwiching a multilayer insulator structure 154D having a strong polarization coupling. The ferroelectric capacitor 150D is analogous to the ferroelectric capacitor(s) 150, 150A, 150B and/or 150C. Consequently, analogous components have similar layers. The electrodes 152 and 156 may include the material(s) described above. Similarly, the multilayer insulator structure 154D includes layers 160, 162 and 170 having interfaces 180D and 182D. The layers 160 and 170 and the layer 162 and 170 are strongly coupled as described above. In addition, the multilayer insulator structure 154D includes an additional ferroelectric layer 172 that also shares an interface 184 with the dielectric layer 162.

The layers 160, 162, 170 and 172 may have a strong polarization coupling. A strong polarization coupling between the layers 160 and 170 is such that the component of the electrical polarization of the ferroelectric layer 170 perpendicular to and near the interface 180D is strongly coupled to the electrical polarization of the dielectric layer 160 perpendicular to and near the interface 180D. The polarization coupling between the layers 162 and 170 is such that the component of the electrical polarization of the ferroelectric layer 170 perpendicular to and near the interface 182D is strongly coupled to the electrical polarization of the dielectric layer 162 perpendicular to and near the interface 182D. Further, the strong polarization coupling between the layers 162 and 172 is such that the component of the electrical polarization of the ferroelectric layer 172 perpendicular to and near the interface 184 between the layers 162 and 172 is strongly coupled to the electrical polarization of the dielectric layer 162 perpendicular to and near the interface 184. In an alternate embodiment, not all of the ferroelectric layers exhibit a strong polarization coupling with the adjoining dielectric layer(s). For example, only the layer 172 may be strongly coupled with dielectric layer 162.

Because of the strong polarization coupling, the electrical polarizations of the layers 160, 162, 170 and 172 are within twenty percent. In some embodiments, the polarizations of the layers 160, 162, 170 and 172 are within ten percent. Similarly, the polarizations of the layers 160, 162, 170 and 172 may be within two percent of each other. The polarizations of the layers 160, 162, 170 and 172 may be within one percent of each other in some embodiments. These conditions may be expressed as above. Alternatively, the strong polarization coupling between the ferroelectric layer 170 and 172 and the dielectric layers 160 and 162 may be expressed in terms of the sum of the thicknesses of the layers. The strong polarization coupling may also be given by:

$$\alpha_{DE} d_{DE} > |\alpha_{FE}| d_{FE} \lambda/(\lambda - |\alpha_{FE}| d_{FE})$$

where $d_{FE}$ is the total thickness of the ferroelectric layer(s), $d_{DE}$ is the total thickness of the dielectric layers and $\lambda$ an interface polarization coupling constant. The total thickness of the ferroelectric layers is a first sum of the thickness for each of the ferroelectric layers 170 and 172 (in this case $t_{170}+t_{172}$). The total thickness of the dielectric layers is a sum of thicknesses for each of the dielectric layers 160 and 162 ($t_{160}+t_{162}$). In an alternate embodiment, the polarization coupling between all of the layers 160, 162, 170 and 172 need not be strong. Instead, the polarization coupling between at least one of the dielectric layers 160 and 162 and at least one of the ferroelectric layers 170 and 172 is strong as defined above. In other embodiments in which the multilayer insulator structure has another number of layers, the expression above may be generalized to the other number of layers. In some embodiments, the polarization coupling is such that the polarization of one or both of the ferroelectric layers 170 and 172 corresponds to that of a dielectric. Stated differently, the electrical polarization(s) of the ferroelectric layer 170 and/or the ferroelectric layer 172 is proportional to the applied electric field with no hysteresis. Such a multilayer insulator structure 154D may have a very high κ in combination with low leakage. Thus, EOT scaling in semiconductor devices such as MOS devices using the multilayer gate insulator structure 150B may be improved.

Figure 9:
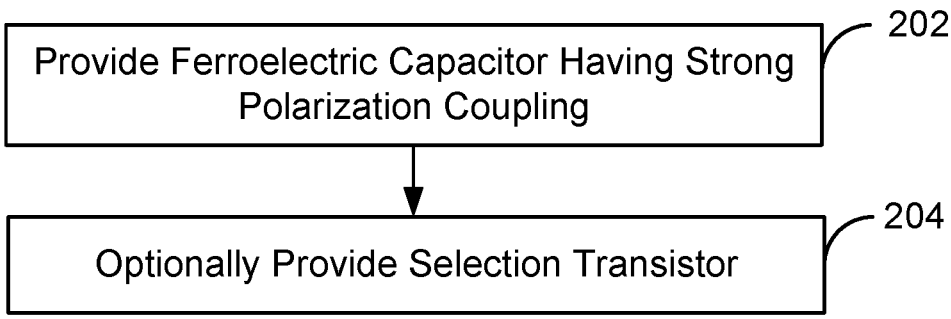
FIG. 9 is a flow chart depicting an exemplary embodiment of a method for providing a semiconductor memory cell including a capacitor having a multilayer insulator structure with a strong polarization coupling.

FIG. 9 is a flow chart depicting an exemplary embodiment of a method 200 for providing a semiconductor memory device including a ferroelectric capacitor having multilayer gate insulating structure with a strong polarization coupling. The method 200 is also described in the context of the semiconductor memory devices 100. However, the method 200 may be used in connection with another semiconductor device. For simplicity, not all steps are shown. Further, the steps may be performed in another order, include substeps and/or be combined. The method 200 is also described in the context of a single semiconductor memory cell being formed. However, it is more typical to form multiple devices substantially simultaneously.

A ferroelectric capacitor 110 having a strong polarization coupling is provided, via step 202. Step 202 may include depositing the layers for the electrode 112, the dielectric 114/multilayer insulator structure 120 and for the electrode 116. The layers may then be masked and portions of the layers removed to define the area of the ferroelectric capacitor 110. A selection transistor 140 for the memory cell 100 may also optionally be fabricated, via step 204. In some embodiments, step 204 is performed before step 202. Step 204 may also include electrically coupling the ferroelectric capacitor 110 to the selection transistor 140. Thus, the memory device 100, 100A, 1008, 100C, 100D and/or an analogous memory device using ferroelectric capacitor 110, 110A, 1108, 110C, 110D, 150, 150A, 150B, 150C, 150D and/or an analogous capacitor, may be formed. Thus, the benefits of such devices may be realized.

Figure 10:
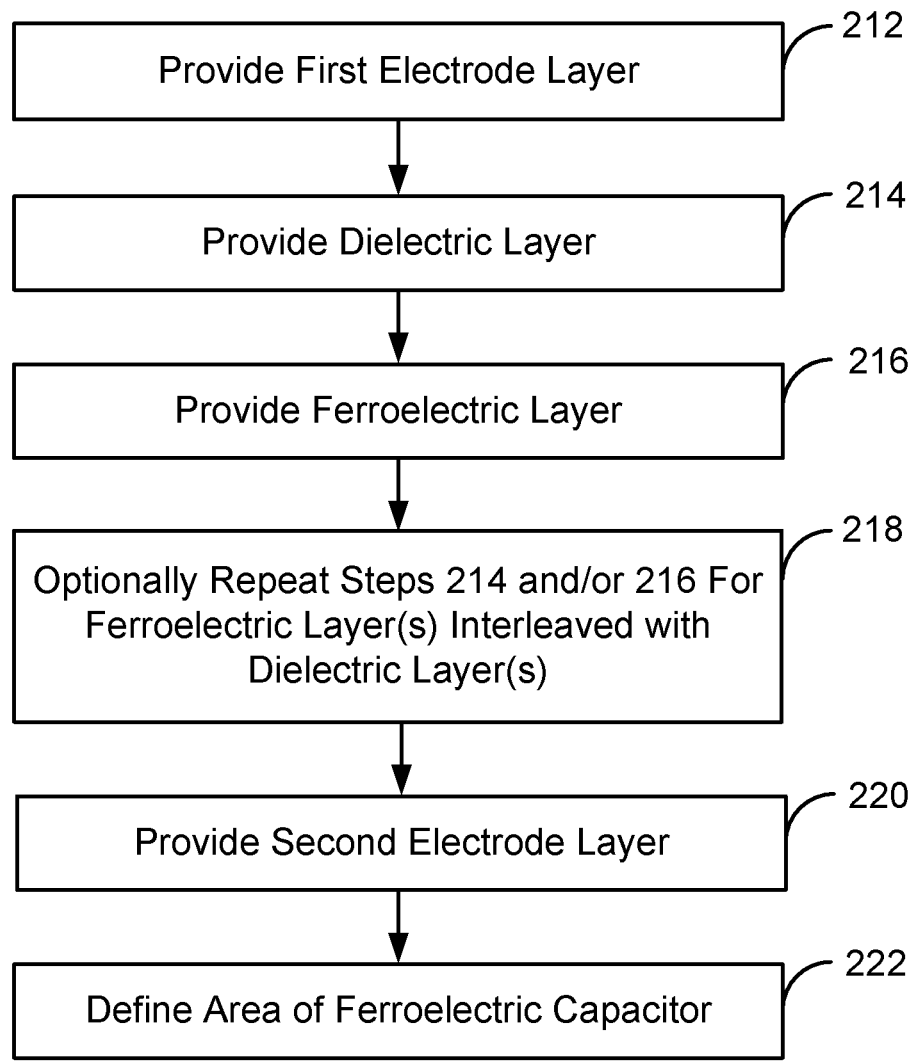
FIG. 10 is a flow chart depicting an exemplary embodiment of a method for providing a ferroelectric capacitor having a multilayer insulator structure with a strong polarization coupling.

FIG. 10 is a flow chart depicting an exemplary embodiment of a method 210 for providing a ferroelectric capacitor having multilayer gate insulating structure with a strong polarization coupling. The method 210 is also described in the context of the ferroelectric capacitor 150. However, the method 210 may be used in connection with another ferroelectric capacitor including but not limited to ferroelectric capacitors 110, 110A, 1108, 110C, 110D, 150A, 150B, 150C and/or 150D. For simplicity, not all steps are shown. Further, the steps may be performed in another order, include substeps and/or be combined. The method 210 is also described in the context of a single ferroelectric capacitor being formed. However, it is more typical to form multiple devices substantially simultaneously.

A first electrode layer is provided, via step 212. Step 212 includes depositing the material(s) that are to be used for the first electrode. For example, SRO and/or TiN might be deposited in step 212.

A dielectric layer and a ferroelectric layer are deposited, via step 214 and 216, respectively. In some embodiments, step 214 is performed prior to step 216. In such embodiments, the dielectric layer 160 is closest to the bottom electrode 152 in the ferroelectric capacitor being formed. In other embodiments, step 216 is performed before step 214. In such embodiments, the ferroelectric layer 170 is closer to the bottom electrode 152. Steps 214 and 216 are also performed such that the dielectric layer 160 and the ferroelectric layer 170 have their polarizations strongly coupled. Material(s) such as one or more of a perovskite oxide such as $SrTiO_3$, $Al_2O_3$, $SiO_2$ and SiON may be deposited in step 214. Material(s) such as one or more of ferroelectric perovskite(s) (such as $Pb(Zr-Ti)O_3$ and/or $BaTiO_3$) and $HfO_2$-based ferroelectric material(s) (such as Si-doped $HfO_2$ or ferroelectric $(Hf-Zr)O_2$) may be provided in step 216. Steps 214 and 216 may also be performed so that the ferroelectric and dielectric layers are epitaxially formed on each other.

Step 214 and/or 216 are optionally repeated, via step 218. Step 218 is performed if the multilayer insulator structure being formed is desired to have more than two layers. In addition, step 218 is performed such that dielectric and ferroelectric layers are interleaved. Thus, if step 214 is performed before step 216, then step 218 repeats step 214 first, and vice versa. Consequently, multilayer insulator structures 154, 154A, 154B, 154C and/or 154D might be formed. Steps 214, 216 and 218 are performed such that the polarizations of some or all of the dielectric and ferroelectric layers are strongly coupled.

The second electrode layer is provided, via step 220. The second electrode may include SRO and/or TiN. The multilayer insulator structure is between the second electrode and the first electrode. The area of the ferroelectric capacitor is defined, via step 222. Fabrication of the device may then be completed.

Using the method 210, one or more of the ferroelectric capacitors may be formed. Consequently, the structures 110, 110A, 110B, 110C, 110D, 150, 150A, 150B, 150B, 150C, 150D and/or an analogous structure may be formed and the benefits thereof realized.

The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A semiconductor memory device comprising:
   a ferroelectric capacitor including a first electrode, a second electrode and a multilayer insulator structure between the first electrode and the second electrode, the multilayer insulator structure including at least one ferroelectric layer and at least one dielectric layer, the at least one ferroelectric layer and the at least one dielectric layer sharing at least one interface and having a strong polarization coupling, wherein the at least one ferroelectric layer has a first polarization, the at least one dielectric layer has a second polarization, the strong polarization coupling being such that the first polarization and the second polarization are within twenty percent of each other.

2. The semiconductor memory device of claim 1 wherein the first polarization and the second polarization are within ten percent of each other.

3. The semiconductor memory device of claim 1 wherein the first polarization and the second polarization are within two percent of each other.

4. The semiconductor memory device of claim 1 wherein the at least one ferroelectric layer includes a first ferroelectric layer, the at least one dielectric layer includes a first dielectric layer, the first ferroelectric layer sharing a first interface of the at least one interface with the first dielectric layer, the multilayer gate insulator structure having an interface polarization coupling constant ($\lambda$) that is at least one of greater than the negative one multiplied by $\alpha_{FE}$ multiplied by $t_{FE}$ ($\lambda > -\alpha_{FE}*t_{FE}$) and greater than the absolute value of $\alpha_{FE}$ multiplied by $t_{FE}$ ($\lambda > |\alpha_{FE}|*t_{FE}$) where $\alpha_{FE}$ is a material parameter of the ferroelectric layer and $t_{FE}$ is a thickness of the ferroelectric layer.

5. The semiconductor memory device of claim 1 wherein the at least one ferroelectric layer includes a first ferroelectric layer, the at least one dielectric layer includes a first dielectric layer and a second dielectric layer, the first ferroelectric layer sharing a first interface of the at least one interface with the first dielectric layer, the first ferroelectric layer sharing a second interface of the at least one interface with the second dielectric layer, the multilayer gate insulator structure having a first interface polarization coupling constant (λ1) for the first interface and a second interface polarization coupling constant (λ2) for the second interface such that a sum of the first and second interface polarization constants is at least one of greater than the negative one multiplied by $\alpha_{FE}$ multiplied by $t_{FE}$ (λ1+λ2>−$\alpha_{FE}$*$t_{FE}$) and greater than the absolute value of $\alpha_{FE}$ multiplied by $t_{FE}$ (λ1+λ2>|$\alpha_{FE}$|*$t_{FE}$) where $\alpha_{FE}$ is a material parameter of the ferroelectric layer and $t_{FE}$ is a thickness of the ferroelectric layer.

6. The semiconductor memory device of claim 1 wherein the multilayer insulator structure has a total thickness of the at least one ferroelectric layer ($d_{FE}$), a total thickness of the at least one dielectric layer ($d_{DE}$), an interface polarization coupling constant (λ), $\alpha_{FE}$ is a material parameter of the at least one ferroelectric layer and a ferroelectric permeability (χ) such that:

$$\alpha_{DE}d_{DE} > |\alpha_{FE}|d_{FE}\lambda/(\lambda - |\alpha_{FE}|d_{FE})$$

where the total thickness of the at least one ferroelectric layer is a first sum of at least one thickness for each of the at least one ferroelectric layer, the total thickness of the at least one dielectric layer is a second sum of at least one thickness for each of the at least one dielectric layer.

7. The semiconductor memory device of claim 1 wherein the at least one dielectric layer includes at least one of a perovskite oxide, $SrTiO_3$, $Al_2O_3$, $SiO_2$ and SiON and wherein the at least one ferroelectric layer includes at least one of a ferroelectric perovskite, (Pb(Zr—Ti)$O_3$), $BaTiO_3$, at least one $HfO_2$-based ferroelectric material, Si-doped $HfO_2$ and ferroelectric (Hf—Zr)$O_2$.

8. The semiconductor memory device of claim 1 wherein the at least one ferroelectric layer is epitaxial to the at least one dielectric layer.

9. The semiconductor memory device of claim 1 wherein the semiconductor memory device is a dynamic random-access memory cell.

10. The semiconductor memory device of claim 9 further comprising:
a selection transistor coupled with the ferroelectric capacitor.

11. A semiconductor memory device comprising:
a ferroelectric capacitor including a first electrode, a second electrode and a multilayer insulator structure between the first electrode and the second electrode, the multilayer insulator structure including at least one ferroelectric layer and at least one dielectric layer, the at least one ferroelectric layer and the at least one dielectric layer sharing at least one interface and having a strong polarization coupling, wherein at least one of the at least one ferroelectric layer has at least one electrical polarization that is free from hysteresis.

12. A semiconductor memory device comprising:
a plurality of memory cells, each of the plurality of memory cells including a ferroelectric capacitor, the ferroelectric capacitor having a first electrode, a second electrode and at least one multilayer insulator structure between the first electrode and the second electrode, the at least one multilayer insulator structure including at least one ferroelectric layer and at least one dielectric layer, the at least one ferroelectric layer and the at least one dielectric layer sharing at least one interface and having a strong polarization coupling, wherein the at least one ferroelectric layer has a first polarization, the at least one dielectric layer has a second polarization, the strong polarization coupling being such that the first polarization and the second polarization are within twenty percent of each other.

13. The semiconductor memory device of claim 12 wherein the first polarization and the second polarization are within ten percent of each other.

14. The semiconductor memory device of claim 11 wherein the semiconductor device is a dynamic random-access memory (DRAM), the at least one dielectric layer includes at least one of a perovskite oxide, $SrTiO_3$, $Al_2O_3$, $SiO_2$ and SiON, and the at least one ferroelectric layer include at least one of a ferroelectric perovskite, (Pb(Zr—Ti)$O_3$), $BaTiO_3$, at least one $HfO_2$-based ferroelectric material, Si-doped $HfO_2$ and ferroelectric (Hf—Zr)$O_2$.

15. A semiconductor device comprising:
a plurality of memory cells, each of the plurality of memory cells including a ferroelectric capacitor, the ferroelectric capacitor having a first electrode, a second electrode and at least one multilayer insulator structure between the first electrode and the second electrode, the at least one multilayer insulator structure including at least one ferroelectric layer and at least one dielectric layer, the at least one ferroelectric layer and the at least one dielectric layer sharing at least one interface and having a strong polarization coupling, wherein the at least one ferroelectric layer is epitaxial to the at least one dielectric layer and has at least one electrical polarization that is free from hysteresis.

16. A method for providing a semiconductor device comprising:
providing a first electrode layer;
providing a multilayer insulator structure on the first electrode layer including
providing at least one ferroelectric layer; and
providing at least one dielectric layer such that the at least one ferroelectric layer and the at least one dielectric layer share at least one interface and have a strong polarization coupling, wherein the at least one ferroelectric layer has a first polarization, the at least one dielectric layer has a second polarization, the strong polarization coupling being such that the first polarization and the second polarization are within twenty percent of each other;
providing a second electrode, the multilayer insulator structure residing between the second electrode and the first electrode.

17. The method of claim 16 wherein the multilayer gate insulator structure has a total thickness of the at least one ferroelectric layer ($d_{FE}$), a total thickness of the at least one dielectric layer ($d_{DE}$), an interface polarization coupling constant (λ), $\alpha_{FE}$ is a material parameter of the at least one ferroelectric layer and a ferroelectric permeability (χ) such that:

$$\alpha_{DE}d_{DE} > |\alpha_{FE}|d_{FE}\lambda/(\lambda - |\alpha_{FE}|d_{FE})$$

where the total thickness of the at least one ferroelectric layer is a first sum of at least one thickness for each of the at least one ferroelectric layer, the total thickness of the at least one dielectric layer is a second sum of at least one thickness for each of the at least one dielectric layer.

18. The semiconductor device of claim 1, wherein a ferroelectric layer of at least one ferroelectric layer and a dielectric layer of the at least one dielectric layer share an interface and have a combined thickness of at least five nanometers and not more than thirty nanometers, the dielectric layer having a thickness of at least 1.5 nm and not more than six nanometers.

19. The semiconductor device of claim 12, wherein a ferroelectric layer of at least one ferroelectric layer and a dielectric layer of the at least one dielectric layer share an interface and have a combined thickness of at least five nanometers and not more than thirty nanometers, the dielectric layer having a thickness of at least 1.5 nm and not more than six nanometers.

20. The method device of claim 16, wherein a ferroelectric layer of at least one ferroelectric layer and a dielectric layer of the at least one dielectric layer share an interface and have a combined thickness of at least five nanometers and not more than thirty nanometers, the dielectric layer having a thickness of at least 1.5 nm and not more than six nanometers.

* * * * *